(12) United States Patent
Uesugi et al.

(10) Patent No.: US 10,763,355 B2
(45) Date of Patent: Sep. 1, 2020

(54) POWER SEMICONDUCTOR DEVICE

(71) Applicant: KABUSHIKI KAISHA TOYOTA CHUO KENKYUSHO, Nagakute-shi, Aichi (JP)

(72) Inventors: Tsutomu Uesugi, Nagakute (JP); Masakazu Kanechika, Nagakute (JP)

(73) Assignee: KABUSHIKI KAISHA TOYOTA CHUO KENKYUSHO, Nagakute-Shi (JP)

( * ) Notice: Subject to any disclaimer, the term of this patent is extended or adjusted under 35 U.S.C. 154(b) by 0 days.

(21) Appl. No.: 16/361,665

(22) Filed: Mar. 22, 2019

(65) Prior Publication Data

US 2019/0305127 A1    Oct. 3, 2019

(30) Foreign Application Priority Data

Apr. 2, 2018  (JP) ................. 2018-070960

(51) Int. Cl.
| | |
|---|---|
| *H01L 29/78* | (2006.01) |
| *H01L 29/10* | (2006.01) |
| *H01L 29/423* | (2006.01) |
| *H01L 29/739* | (2006.01) |
| *H01L 29/08* | (2006.01) |

(52) U.S. Cl.
CPC ...... *H01L 29/7813* (2013.01); *H01L 29/0865* (2013.01); *H01L 29/1095* (2013.01); *H01L 29/4236* (2013.01); *H01L 29/7397* (2013.01)

(58) Field of Classification Search
CPC ............. H01L 29/7397; H01L 29/7813; H01L 29/1095
See application file for complete search history.

(56) References Cited

U.S. PATENT DOCUMENTS

2004/0164349 A1* 8/2004 Nishiwaki ........... H01L 29/0696
257/330

FOREIGN PATENT DOCUMENTS

WO      2016/067374 A1    5/2016

* cited by examiner

*Primary Examiner* — Robert G Bachner
*Assistant Examiner* — Molly K Reida
(74) *Attorney, Agent, or Firm* — Oliff PLC

(57) ABSTRACT

A semiconductor device may include: a semiconductor layer; and a trench gate. The semiconductor layer may include: a first semiconductor region of a first conductive type; a second semiconductor region of a second conductive type provided above the first semiconductor region and facing a side surface of the trench gate; and a third semiconductor region of the first conductive type provided above the second semiconductor region, separated from the first semiconductor region by the second semiconductor region, and facing the side surface of the trench gate. The first semiconductor region may include: a lower semiconductor region; and an upper semiconductor region disposed between the lower semiconductor region and the second semiconductor region and having a lower impurity concentration than the lower semiconductor region. The upper semiconductor region may be disposed at a shallower position than the trench gate and face the side surface of the trench gate.

3 Claims, 3 Drawing Sheets

POWER SEMICONDUCTOR DEVICE

CROSS-REFERENCE TO RELATED APPLICATION

This application claims priority to Japanese Patent Application No. 2018-070960 filed on Apr. 2, 2018, the contents of which are hereby incorporated by reference into the present application.

TECHNICAL FIELD

The present disclosure relates to a semiconductor device.

DESCRIPTION OF RELATED ART

A semiconductor device is used in a power conversion device such as an inverter, and is used to control power supply to a load such as a motor. As described in International Publication No. WO 2016/067374, the load may be short-circuited due to various reasons. In such cases, the semiconductor device is exposed to stress of high voltage and large current. The stress of high voltage and large current when the load is short-circuited may bring forth a risk of thermal destruction of the semiconductor device.

BRIEF SUMMARY

Thus, a technique that reduces saturated current generated when a short circuit occurs to improve a short circuit tolerance is in demand. For example, the saturated current generated when a short circuit occurs can be reduced by increasing a channel resistance. However, such an increase in the channel resistance increases an on-resistance in a normal operation. As such, it is known that the saturated current generated when a short circuit occurs and the on-resistance in the normal operation are in a tradeoff relationship. A technique that improves such a tradeoff relationship is in demand.

In an embodiment disclosed herein, a semiconductor device may comprise a semiconductor layer; and a trench gate extending from a front surface of the semiconductor layer toward a back surface thereof. The semiconductor layer may comprise a first semiconductor region of a first conductive type; a second semiconductor region of a second conductive type provided above the first semiconductor region and facing a side surface of the trench gate; and a third semiconductor region of the first conductive type provided above the second semiconductor region, separated from the first semiconductor region by the second semiconductor region, and facing the side surface of the trench gate. The first semiconductor region may comprise: a lower semiconductor region; and an upper semiconductor region disposed between the lower semiconductor region and the second semiconductor region and having a lower impurity concentration than the lower semiconductor region. The upper semiconductor region may be disposed at a shallower position than the trench gate and face the side surface of the trench gate. In the semiconductor device with such a configuration, the presence of the upper semiconductor region between the lower semiconductor region and the second semiconductor region enables suppression of an increase in an on-resistance in a normal operation as well as reduction in saturated current generated when a short circuit occurs.

DETAILED DESCRIPTION

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
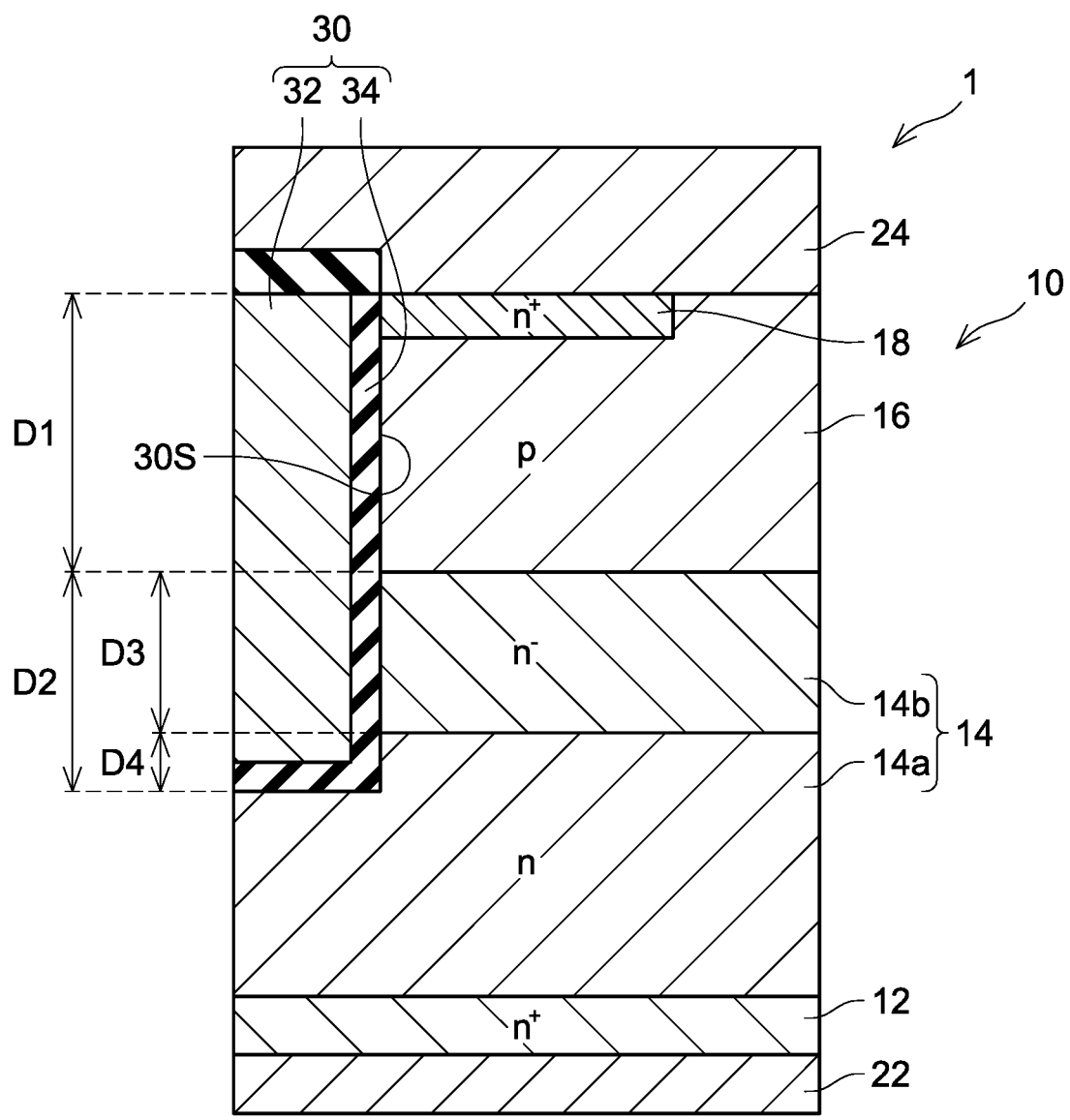
FIG. 1 schematically shows a cross-sectional view of a primary portion corresponding to a half cell of a semiconductor device.

FIG. 1 shows a cross-sectional view of a primary portion corresponding to a half cell of a semiconductor device 1. As shown in FIG. 1, the semiconductor device 1 is a semiconductor device of a type called n channel-type MOSFET (Metal Oxide Semiconductor Field Effect Transistor), and includes a semiconductor layer 10, a drain electrode 22 covering a back surface of the semiconductor layer 10, a source electrode 24 covering a front surface of the semiconductor layer 10, and a trench gate 30 provided in a front layer portion of the semiconductor layer 10. The semiconductor layer 10 includes an n-type drain region 12, an n-type drift region 14, a p-type body region 16, and an n-type source region 18. A material of the semiconductor layer 10 is not particularly limited, and may be, for example, silicon. Instead of this, the material of the semiconductor layer 10 may be silicon carbide or a nitride semiconductor. Here, the drift region 14 is an example of a first semiconductor region disclosed herein, the body region 16 is an example of a second semiconductor region disclosed herein, and the source region 18 is an example of a third semiconductor region disclosed herein.

The drain region 12 is provided in a back layer portion of the semiconductor layer 10, and contains n-type impurities at a high concentration. The drain region 12 is disposed at a position exposed at the back surface of the semiconductor layer 10 and is in ohmic contact with the drain electrode 22.

The drift region 14 is provided on a front surface of the drain region 12, disposed between the drain region 12 and the body region 16, and is in contact with both the drain region 12 and the body region 16. The drift region 14 includes a lower drift region 14a and an upper drift region 14b. The lower drift region 14a is disposed closer to the drain region 12 than the upper drift region 14b, is disposed between the drain region 12 and the upper drift region 14b, and is in contact with both the drain region 12 and the upper drift region 14b. The upper drift region 14b is disposed closer to the body region 16 than the lower drift region 14a, is disposed between the lower drift region 14a and the body region 16, and is in contact with both the lower drift region 14a and the body region 16. The upper drift region 14b faces a side surface 30S of the trench gate 30. More specifically, the upper drift region 14b is provided to contact the side surface 30S of the trench gate 30. An n-type impurity concentration of the upper drift region 14b is lower than an n-type impurity concentration of the lower drift region 14a. Here, the lower drift region 14a is an example of a lower semiconductor region disclosed herein, and the upper drift region 14b is an example of an upper semiconductor region disclosed herein.

The body region 16 is provided on a front surface of the drift region 14, is disposed between the drift region 14 and the source region 18, and is in contact with both the drift region 14 and the source region 18. The body region 16 is provided in the front layer portion of the semiconductor layer 10, is disposed at a position exposed at the front surface of the semiconductor layer 10, and is in ohmic contact with the source electrode 24. The body region 16 faces the side surface 30S of the trench gate 30. More specifically, the body region 16 is provided to contact the side surface 30S of the trench gate 30.

The source region 18 is provided at a front surface of the body region 16, is provided in the front layer portion of the semiconductor layer 10, is separated from the drift region 14 by the body region 16, and faces the side surface 30S of the trench gate 30. More specifically, the source region 18 is provided to contact the side surface 30S of the trench gate 30. The source region 18 is disposed at a position exposed at the front surface of the semiconductor layer 10 and is in ohmic contact with the source electrode 24.

The trench gate 30 extends from the front surface of the semiconductor layer 10 toward the back surface thereof and includes a gate electrode 32 and a gate insulating film 34. The gate electrode 32 has its side surface and bottom surface covered by the gate insulating film 34.

Here, a depth D1 of the body region 16 (a distance from the front surface of the semiconductor layer 10 to a lower surface of the body region 16) is about 1 μm. A protruding depth D2 of the trench gate 30 into the drift region 14 (a distance from an interface between the drift region 14 and the body region 16 to a bottom surface of the trench gate 30) is about 0.7 μm. A thickness D3 of the upper drift region 14b (a distance from the interface between the drift region 14 and the body region 16 to a lower surface of the upper drift region 14b) is about 0.5 μm. A protruding depth D4 of the trench gate 30 into the lower drift region 14a (a distance from an interface between the lower drift region 14a and the upper drift region 14b to the bottom surface of the trench gate 30) is about 0.2 μm. Further, the n-type impurity concentration of the lower drift region 14a is about $2\times10^{16}$ cm$^{-3}$, the n-type impurity concentration of the upper drift region 14b is about $1\times10^{15}$ cm$^{-3}$, and a p-type impurity concentration of the body region 16 is about $5\times10^{17}$ cm$^{-3}$. These physical property values are mere examples and may suitably be adjusted.

Next, an operation of the semiconductor device 1 during a normal operation will be described. When a voltage higher than that of the source electrode 24 is applied to the drain electrode 22 and a voltage higher than a threshold voltage is applied to the gate electrode 32, the semiconductor device 1 is turned on. At this occasion, a channel (an inverted layer) is generated in a portion of the body region 16 adjacent to the side surface 30S of the trench gate 30, and an accumulation layer is generated in a portion of the upper drift region 14b adjacent to the side surface 30S of the trench gate 30. Electrons introduced from the source region 18 travel to the lower drift region 14a through the channel (the inverted layer) generated in the body region 16 and the accumulation layer generated in the upper drift region 14b, by which the semiconductor device 1 is turned on. Since the upper drift region 14b is disposed at a position facing the side surface 30S of the trench gate 30 (in other words, the upper drift region 14b is disposed at a shallower position than the bottom surface of the trench gate 30), the accumulation layer is generated in the upper drift region 14b when the semiconductor device 1 is turned on. Due to this, in the semiconductor device 1, an increase in on-resistance is suppressed despite the presence of the upper drift region 14b having the low impurity concentration. When the voltage applied to the gate electrode 32 becomes lower than the threshold voltage, the channel in the body region 16 vanishes and the semiconductor device 1 is thereby turned off.

Next, an operation of the semiconductor device 1 when a short circuit occurs will be described. When a load is short-circuited, a high voltage (such as 100 V) corresponding to a power source voltage is applied between the drain electrode 22 and the source electrode 24. At this occasion, due to the presence of the upper drift region 14b having the low impurity concentration, a depletion layer spreading from a pn junction between the upper drift region 14b and the body region 16 can spread beyond the upper drift region 14b to cover the bottom surface of the trench gate 30 within an extremely short period of time. As above, when the short circuit occurs, a JFET effect is produced by the spread of the depletion layer and a channel resistance of the semiconductor device 1 thereby increases. Due to this, in the semiconductor device 1, saturated current generated when the short circuit occurs is reduced.

As described above, since the upper drift region 14b having the low impurity concentration is provided shallower than the trench gate 30, the increase in the on-resistance is suppressed during the normal operation. Meanwhile, since the upper drift region 14b having the low impurity concentration is present, the saturated current is reduced by the JFET effect when a short circuit occurs. As above, in the semiconductor device 1, due to the upper drift region 14b disposed between the lower drift region 14a and the body region 16, the increase in the on-resistance can be suppressed in the normal operation and further the saturated current generated when a short circuit occurs can be reduced.

Figure 2:
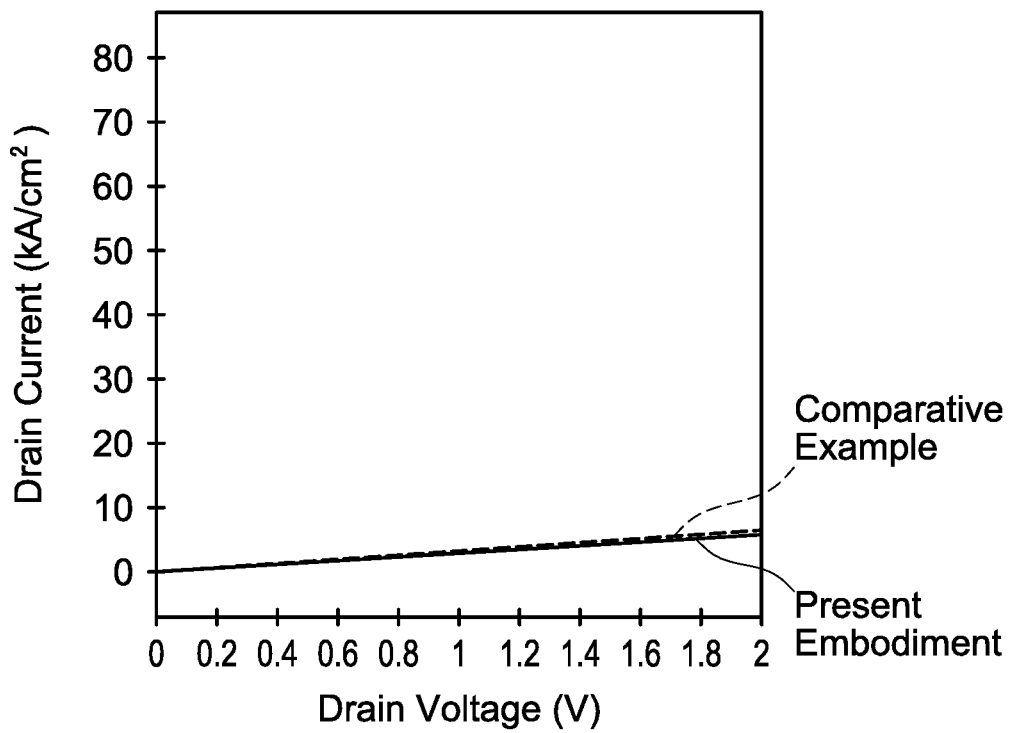
FIG. 2 shows a relationship between drain voltage and drain current in a normal operation of the semiconductor device.

FIG. 2 shows results of simulation on a characteristic of the semiconductor device 1 of the present embodiment and a comparative example in the normal operation. A gate voltage is 20 V. In the comparative example, the upper drift region 14b is not provided (a region corresponding to the upper drift region 14b of the present embodiment is set to have the same concentration as that of the lower drift region 14a). As shown in FIG. 2, it was confirmed that the characteristic of the semiconductor device 1 in the normal operation was not different from that of the comparative example. That is, it can be understood that the increase in the on-resistance is suppressed even though the upper drift region 14b having the low impurity concentration is provided.

Figure 3:
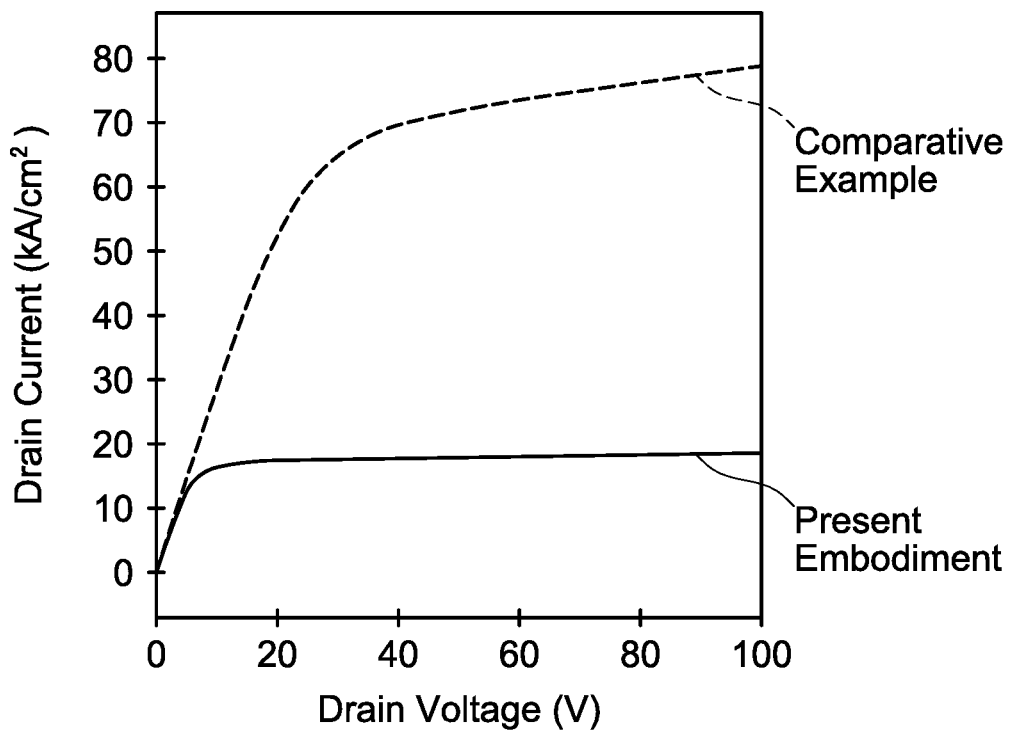
FIG. 3 shows a relationship between the drain voltage and the drain current when a short circuit occurs in the semiconductor device.

FIG. 3 shows results of simulation on the characteristic of the semiconductor device 1 of the present embodiment and the comparative example when a short circuit occurs. The gate voltage is 20 V. A configuration of a comparative example is same as that in FIG. 2. As shown in FIG. 3, it was confirmed that short-circuit current in the semiconductor device 1 was suppressed at 20 kA/cm$^2$, whereas short-circuit current in the comparative example is 80 kA/cm$^2$. As above, it was confirmed that the semiconductor device 1 can reduce the saturated current generated when a short circuit occurs while suppressing the increase in the on-resistance in the normal operation.

As above, due to the upper drift region 14b disposed between the lower drift region 14a and the body region 16, the semiconductor device 1 can reduce the saturated current generated when a short circuit occurs while suppressing the increase in the on-resistance in the normal operation. Further, in the semiconductor device 1, a high accuracy is not required for a positional relationship between the trench gate 30 and the upper drift region 14b in a planar direction of the semiconductor layer 10. Due to this, the semiconductor device 1 has a feature that its manufacture is simple.

Figure 4:
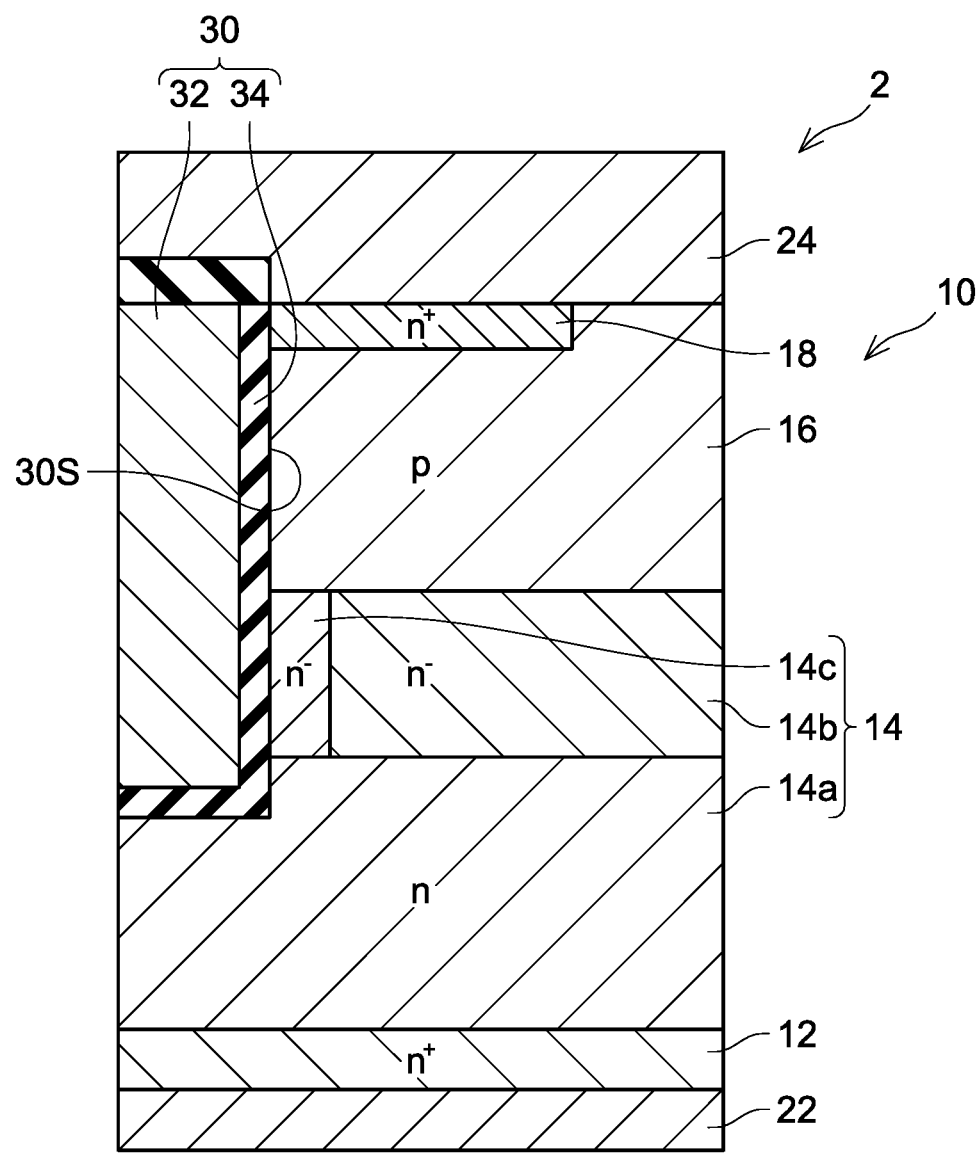
FIG. 4 schematically shows a cross-sectional view of a primary portion corresponding to a half cell of a semiconductor device of a variant.

FIG. 4 shows a cross-sectional view of a primary portion corresponding to a half cell of a semiconductor device 2 of a variant. The semiconductor device 2 is characteristic in that the drift region 14 further includes a side surface region 14c. The side surface region 14c is disposed between the side surface 30S of the trench gate 30 and the upper drift region 14b, and is in contact with both the side surface 30S of the trench gate 30 and the upper drift region 14b. An n-type impurity concentration of the side surface region 14c is higher than the n-type impurity concentration of the upper drift region 14b. Moreover, the n-type impurity concentration of the side surface region 14c is lower than the n-type impurity concentration of the lower drift region 14a. The impurity concentration of the side surface region 14c is about $1 \times 10^{16}$ cm$^{-3}$. This is merely an example, and the n-type impurity concentration of the side surface region 14c may suitably be adjusted. The side surface region 14c has a width which encompasses a range of the accumulation layer generated at the position adjacent to the side surface 30S of the trench gate 30 when the semiconductor device 2 is turned on. Here, the width of the side surface region 14c is a width in a direction perpendicularly intersecting the side surface 30S of the trench gate 30. The width of the side surface region 14c is 50 to 200 nm. This is merely an example, and the width of the side surface region 14c may suitably be adjusted.

In the semiconductor device 2, the side surface region 14c is provided to contact the side surface 30S of the trench gate 30. This side surface region 14c has the higher n-type impurity concentration than the upper drift region 14b. Due to this, an electric resistance in the accumulation layer can be reduced when the semiconductor device 2 is turned on. In the semiconductor device 2, the increase in the on-resistance during the normal operation is further suppressed.

The above embodiment exemplified a MOSFET, however, the art described in the claims may be applied to other types of semiconductor devices provided with a trench gate, such as an IGBT (Insulated Gate Bipolar Transistor).

Specific examples of the present disclosure have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Some of the features characteristic to the above-described embodiment will herein be listed. It should be noted that the respective technical elements are independent of one another, and are useful solely or in combinations. The combinations thereof are not limited to those described in the claims as originally filed.

In an embodiment disclosed herein, a semiconductor device may comprise a semiconductor layer; and a trench gate extending from a front surface of the semiconductor layer toward a back surface thereof. A material of the semiconductor layer is not particularly limited. The semiconductor layer may comprise a first semiconductor region of a first conductive type; a second semiconductor region of a second conductive type provided above the first semiconductor region and facing a side surface of the trench gate; and a third semiconductor region of the first conductive type provided above the second semiconductor region, separated from the first semiconductor region by the second semiconductor region, and facing the side surface of the trench gate. The first semiconductor region may comprise a lower semiconductor region; and an upper semiconductor region disposed between the lower semiconductor region and the second semiconductor region and having a lower impurity concentration than the lower semiconductor region. The upper semiconductor region may be disposed at a shallower position than the trench gate and face the side surface of the trench gate.

In the semiconductor device of the above embodiment, the first semiconductor region may further comprise a side surface region disposed between the side surface of the trench gate and the upper semiconductor region and having a higher impurity concentration than the upper semiconductor region.

In the semiconductor device of the above embodiment, the impurity concentration of the side surface region may be lower than that of the lower semiconductor region.

In the semiconductor device of the above embodiment, a width of the side surface region in a direction perpendicularly intersecting the side surface of the trench gate may be in a range of 50 to 200 nm.

What is claimed is:
1. A semiconductor device comprising:
a semiconductor layer; and
a trench gate extending from a front surface of the semiconductor layer toward a back surface thereof,
wherein the semiconductor layer comprises:
a first semiconductor region of a first conductive type;
a second semiconductor region of a second conductive type provided above the first semiconductor region and facing a side surface of the trench gate; and
a third semiconductor region of the first conductive type provided above the second semiconductor region, separated from the first semiconductor region by the second semiconductor region, and facing the side surface of the trench gate, and wherein the first semiconductor region comprises:
a lower semiconductor region; and
an upper semiconductor region disposed between the lower semiconductor region and the second semiconductor region and having a lower impurity concentration than the lower semiconductor region,
the upper semiconductor region being disposed at a shallower position than the trench gate and faces the side surface of the trench gate; and
a side surface region disposed between the side surface of the trench gate and the upper semiconductor region and having a higher impurity concentration than the upper semiconductor region.

2. The semiconductor device according to claim 1, wherein
the impurity concentration of the side surface region is lower than that of the lower semiconductor region.

3. The semiconductor device according to claim 1, wherein
a width of the side surface region in a direction perpendicularly intersecting the side surface of the trench gate is in a range of 50 to 200 nm.

* * * * *